United States Patent
Kang et al.

(10) Patent No.: US 7,274,593 B2
(45) Date of Patent: Sep. 25, 2007

(54) NONVOLATILE FERROELECTRIC MEMORY DEVICE

(75) Inventors: Hee Bok Kang, Daejeongwangyeok-si (KR); Jin Hong Ahn, Gyeonggi-do (KR); Jae Jin Lee, Gyeonggi-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 146 days.

(21) Appl. No.: 11/115,302

(22) Filed: Apr. 27, 2005

(65) Prior Publication Data

US 2006/0138520 A1    Jun. 29, 2006

(30) Foreign Application Priority Data

Dec. 29, 2004   (KR) ...................... 10-2004-0115394
Dec. 29, 2004   (KR) ...................... 10-2004-0115395

(51) Int. Cl.
*G11C 16/04*   (2006.01)

(52) U.S. Cl. .................. 365/185.05; 365/145; 365/147

(58) Field of Classification Search ................ 365/145, 365/147, 185.85, 185.05; 257/295
See application file for complete search history.

(56) References Cited

U.S. PATENT DOCUMENTS

| | | | |
|---|---|---|---|
| 5,723,885 A | 3/1998 | Ooishi | |
| 5,751,037 A | 5/1998 | Aozasa et al. | |
| 5,753,946 A | 5/1998 | Naiki et al. | |
| 6,054,734 A * | 4/2000 | Aozasa et al. | 257/315 |
| 6,151,241 A | 11/2000 | Hayashi et al. | |
| 6,222,756 B1 | 4/2001 | Lee | |
| 6,532,165 B1 | 3/2003 | Katori | |

(Continued)

FOREIGN PATENT DOCUMENTS

JP    H09-116036    10/1995

(Continued)

OTHER PUBLICATIONS

Christer Svensson, Forty Years of Feature-Size Predictions, IEEE International Solid-State Circuits Conference, 2003, Digest of Technical Papers, S.35-36, 28-29; Sp. 2,3.Abs.

*Primary Examiner*—Gene N. Auduong
(74) *Attorney, Agent, or Firm*—Townsend & Townsend & Crew LLP

(57) ABSTRACT

A nonvolatile ferroelectric memory device is provided so as to control read/write operations of a nonvolatile memory cell using a channel resistance of the memory cell which is differentiated by polarity states of a ferroelectric material. In the memory device, an insulating layer is formed on a bottom word line, and a floating channel layer comprising a P-type drain region, a P-type channel region and a P-type source region is formed on the insulating layer. Then, a ferroelectric layer is formed on the floating channel layer, and a word line is formed on the ferroelectric layer. As a result, the resistance state induced to the channel region is controlled depending on the polarity of the ferroelectric layer, thereby regulating the read/write operations of the memory cell array.

20 Claims, 17 Drawing Sheets

U.S. PATENT DOCUMENTS

| | | |
|---|---|---|
| 6,580,633 B2 * | 6/2003 | Inoue et al. ................ 365/145 |
| 6,614,066 B2 | 9/2003 | Stengl et al. |
| 6,777,255 B2 | 8/2004 | Yamazaki |
| 6,784,473 B2 | 8/2004 | Sakai et al. |
| 6,787,832 B2 | 9/2004 | Schmid et al. |
| 2002/0054522 A1 | 5/2002 | Inoue et al. |
| 2003/0223292 A1 | 12/2003 | Nejad et al. |
| 2006/0138504 A1 * | 6/2006 | Kang et al. ................ 257/295 |

FOREIGN PATENT DOCUMENTS

| | | |
|---|---|---|
| JP | 08-335645 | 12/1996 |
| JP | 09-097851 | 4/1997 |
| JP | 10-303378 | 11/1998 |
| JP | 11-274423 | 10/1999 |
| JP | 2001-110192 | 4/2001 |
| JP | 2002-358776 | 10/2001 |
| KR | 2003-0060741 | 8/2002 |
| KR | 1020030024223 A | 3/2003 |

* cited by examiner

CURRENT PATH
(LOW RESISTANCE : CHANNEL ON)

CURRENT PATH
(LOW RESISTANCE : CHANNEL OFF)

NONVOLATILE FERROELECTRIC MEMORY DEVICE

BACKGROUND OF THE INVENTION

1. Field of the Invention

The present invention generally relates to a nonvolatile ferroelectric memory device, and more specifically, to a technology of controlling read/write operations of a nonvolatile ferroelectric memory cell using a channel resistance of a memory cell which is differentiated by polarization states of a ferroelectric material in a nano scale memory device.

2. Description of the Related Art

Generally, a ferroelectric random access memory (hereinafter, referred to as 'FeRAM') has attracted considerable attention as next generation memory device because it has a data processing speed as fast as a Dynamic Random Access Memory (hereinafter, referred to as 'DRAM') and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2001-57275 by the same inventor of the present invention. Therefore, the basic structure and the operation on the FeRAM are not described herein.

A unit cell of a conventional nonvolatile FeRAM device comprises a switching element and a nonvolatile ferroelectric capacitor. The switching element performs a switching operation depending on a state of a word line to connect a nonvolatile ferroelectric capacitor to a sub bit line. The nonvolatile ferroelectric capacitor is connected between and a plate line and one terminal of the switching element.

Here, the switching element of the conventional FeRAM is a NMOS transistor whose switching operation is controlled by a gate control signal.

FIG. 1 is a cross-sectional diagram illustrating a conventional nonvolatile ferroelectric memory device.

A conventional 1-T (One-Transistor) FET (Field Effect Transistor) cell comprises a N-type drain region 2 and a N-type source region 3 which are formed on a P-type region substrate 1. A ferroelectric layer 4 is formed on a channel region, and a word line 5 is formed on the ferroelectric layer 4.

The above-described conventional nonvolatile FeRAM device reads and writes data by using a channel resistance of the memory cell which is differentiated depending on polarization states of the ferroelectric layer 4. That is, when the polarity of the ferroelectric layer 4 induces positive charges to the channel, the memory cell becomes at a high resistance state to be turned off. On the contrary, when the polarity of the ferroelectric layer 4 induces negative charges to the channel, the memory cell becomes at a low resistance state to be turned on.

However, in the conventional nonvolatile FeRAM device, when the cell size becomes smaller, a data maintaining characteristic is degraded, so that it is difficult to perform the normal operation of the cell. That is, a voltage is applied to an adjacent cell at read/write modes to destroy data of unselected cells, so that interface noise is generated between the cells and it is difficult to perform a random access operation.

SUMMARY OF THE INVENTION

Accordingly, it is an object of the present invention to form a floating channel layer comprising a P-type drain region, a P-type channel region and P-type source region between a word line and a bottom word line, thereby improving a data maintaining characteristic.

It is another object of the present invention to provide the above-described memory cell so as to control read/write operations of a memory cell array, thereby improving reliability of the cell and reducing the whole size of the cell at the same time.

In an embodiment, a nonvolatile ferroelectric memory device comprises an insulating layer formed on a bottom word line, a floating channel layer, a ferroelectric layer formed on the channel region of the floating channel layer, and a word line formed on the ferroelectric layer. The floating channel layer comprises a P-type channel region formed on the insulating layer and kept at a floating state, a P-type drain region and a P-type source region which are connected to both sides of the channel region. Here, different channel resistance is induced to the channel region depending on polarity states of the ferroelectric layer, so that data are read and written.

In another embodiment, a nonvolatile ferroelectric memory device comprising a unit cell array which includes a plurality of bottom word lines, a plurality of insulating layers, a floating channel layer, a plurality of ferroelectric layers, and a plurality of word lines. The plurality of insulating layers are formed on the plurality of bottom word lines, respectively. The floating channel layer comprises a plurality of P-type channel regions located on the plurality of insulating layers and a plurality of P-type drain and source regions which are alternately connected in series to the plurality of P-type channel regions. The plurality of ferroelectric layers are formed respectively on the plurality of P-type channel regions of the floating channel layer. The plurality of word lines formed on the plurality of ferroelectric layers, respectively. Here, the unit cell array reads and writes a plurality of data by inducing different channel resistance to the plurality of P-type channel regions depending on polarity states of the plurality of ferroelectric layers.

In still another embodiment, a nonvolatile ferroelectric memory device comprises a plurality of memory cells, a first switching element, and a second switching element. Switching operations of the plurality of memory cells are selectively controlled respectively depending on voltages applied to a plurality of word lines and a plurality of bottom word lines and where floating channel layers are connected serially. The first switching element selectively connects the plurality of memory cells to a bit line in response to a first selecting signal. The second switching element selectively connects the plurality of memory cells to a sensing line in response to a second selecting signal. Here, each of the plurality of memory cells comprises an insulating layer formed on the bottom word line, the floating channel layer comprising a P-type channel region formed on the insulating layer and kept at a floating state, a P-type drain region and a P-type source region which are connected to both sides of the channel region, a ferroelectric layer formed on the channel region of the floating channel layer, and a word line formed on the ferroelectric layer.

In still another embodiment, a nonvolatile ferroelectric memory device comprises a plurality of bit lines arranged in a row direction, a plurality of sensing lines arranged perpendicular to the plurality of bit lines, a plurality of memory cells arranged in row and column directions where the plurality of bit lines and the plurality of sensing lines are crossed, and a plurality of sense amplifiers connected one by one to the plurality of bit lines. Here, each of the plurality of memory cells comprises an insulating layer formed on a bottom word line, the floating channel layer comprising a P-type channel region formed on the floating layer and kept at a floating state, a P-type drain region and a P-type source region which are connected to both sides of the channel region, a ferroelectric layer formed on the channel region of the floating channel layer, and a word line formed on the ferroelectric layer.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
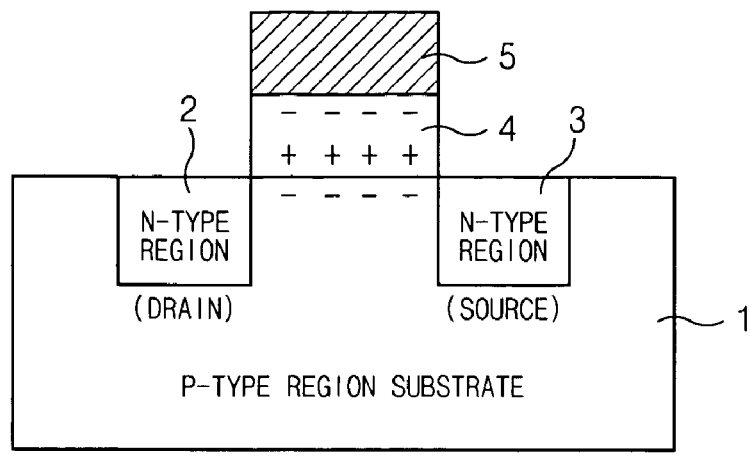
FIG. 1 is a cross-sectional diagram illustrating a conventional nonvolatile ferroelectric memory device.
Figure 2A:
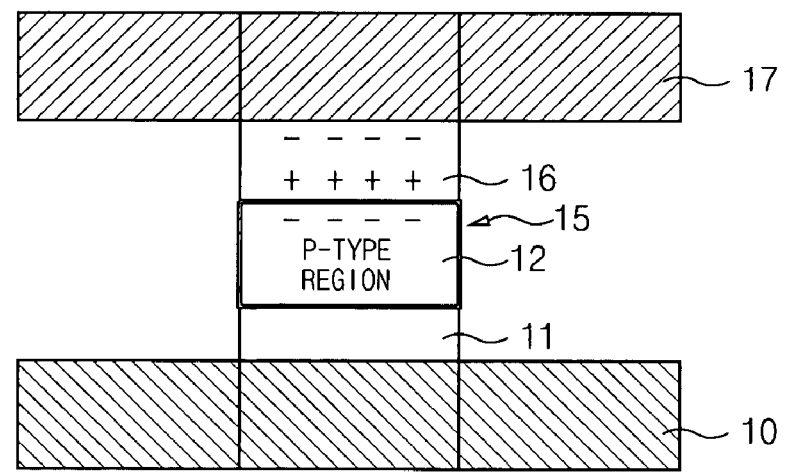
FIGS. 2a to 2c are diagrams illustrating a cross section of a cell and its symbol of a nonvolatile ferroelectric memory device according to an embodiment of the present invention.
Figure 2B:
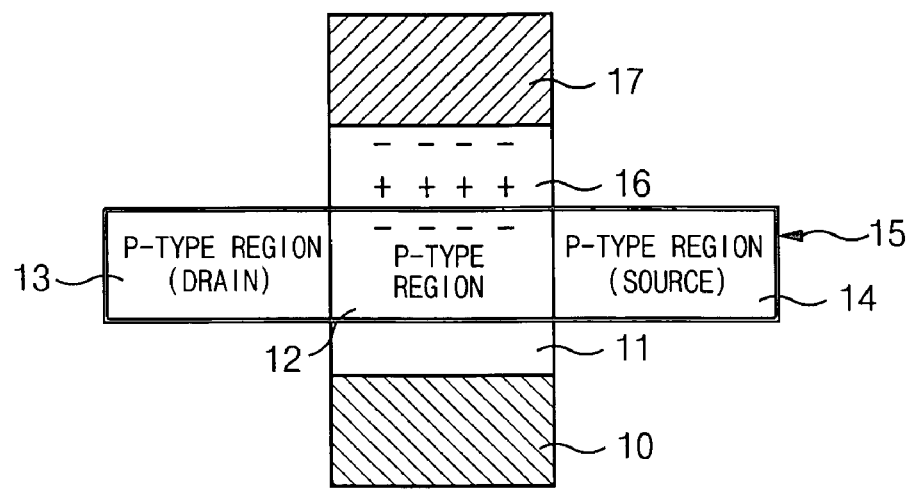
Figure 2C:
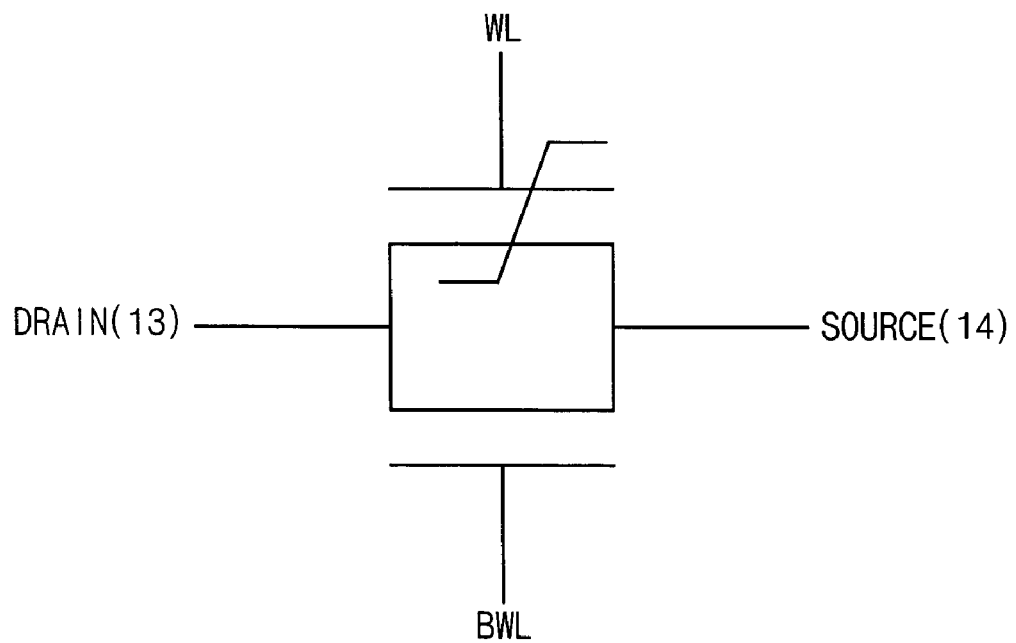

FIGS. 2a to 2c are diagrams illustrating a cross section of a cell and its symbol of a nonvolatile ferroelectric memory device according to an embodiment of the present invention.

FIG. 2a is a cross-sectional diagram illustrating a unit cell in a direction in parallel with a word line.

A bottom word line 10 formed in the bottom layer of the unit cell is arranged in parallel with a word line 17 formed in the top layer of the unit cell. Here, the bottom word line 10 and the word line 17 are selectively driven by the same row address decoder (not shown). An insulating layer 11 is formed on the bottom word line 10, and a floating channel layer 15 comprising a P-type channel region 12 is formed on the insulating layer 11.

A ferroelectric layer 16 is formed on the floating channel layer 15, and the word line 17 is formed on the ferroelectric layer 16.

FIG. 2b is a cross-sectional diagram illustrating a unit cell in a direction perpendicular to the word line.

The insulating layer 11 is formed on the bottom word line 10. The floating channel layer 15 is formed on the insulating layer 11. Here, a drain region 13 and a source region 14 are formed with a P-type, and the channel region 12 is formed with a P-type in the floating channel layer 15, which becomes at a floating state.

For a semiconductor of the floating channel layer 15, materials such as a carbon nano tube, silicon and Ge(Germanium) can be used. The ferroelectric layer 16 is formed on the P-type channel region 12 of the floating channel layer 15, and the word line 17 is formed on the ferroelectric layer 16.

As a result, the nonvolatile ferroelectric memory device according to an embodiment of the present invention reads and writes data by using a channel resistance of the floating channel layer 15 which is differentiated by polarization states of the ferroelectric layer 16. That is, when the polarity of the ferroelectric layer 16 induces positive charges to the channel region 12, the memory cell becomes at a low resistance state, so that the channel is turned on. On the contrary, when the polarity of the ferroelectric layer 16 induces negative charges to the channel region 12, the memory cell becomes at a high resistance state, so that the channel is turned off.

The above-described unit memory cell according to the embodiment of the present invention is represented by a symbol shown in FIG. 2c.

Figure 3A:
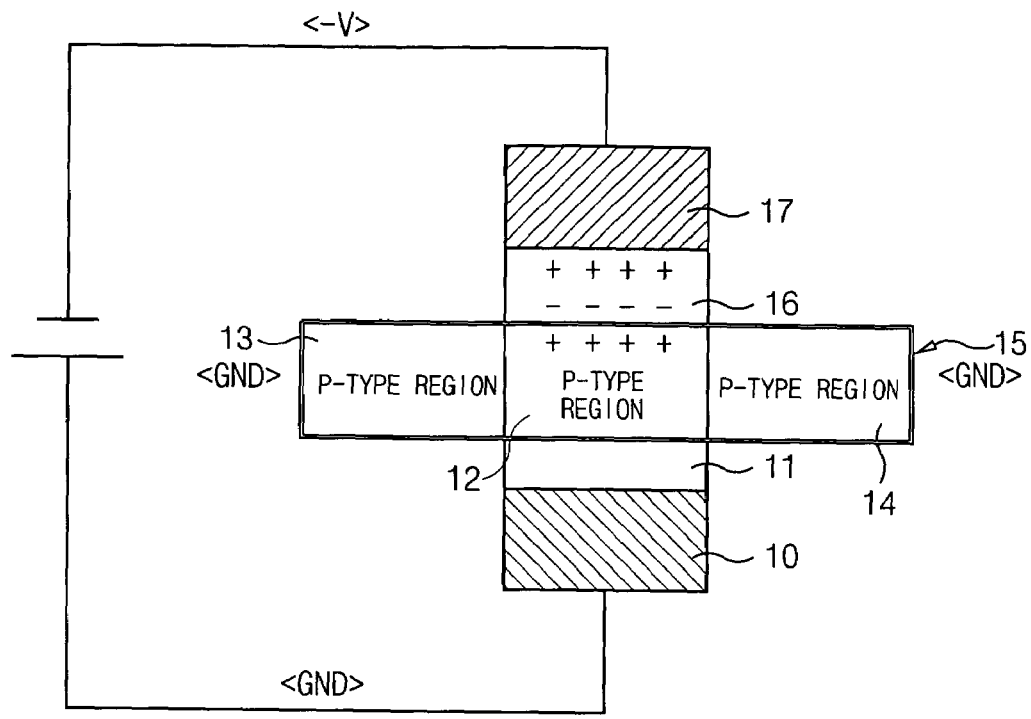
FIGS. 3a and 3c are diagrams illustrating write and read operations on high data of the nonvolatile ferroelectric memory device according to an embodiment of the present invention.
Figure 3B:
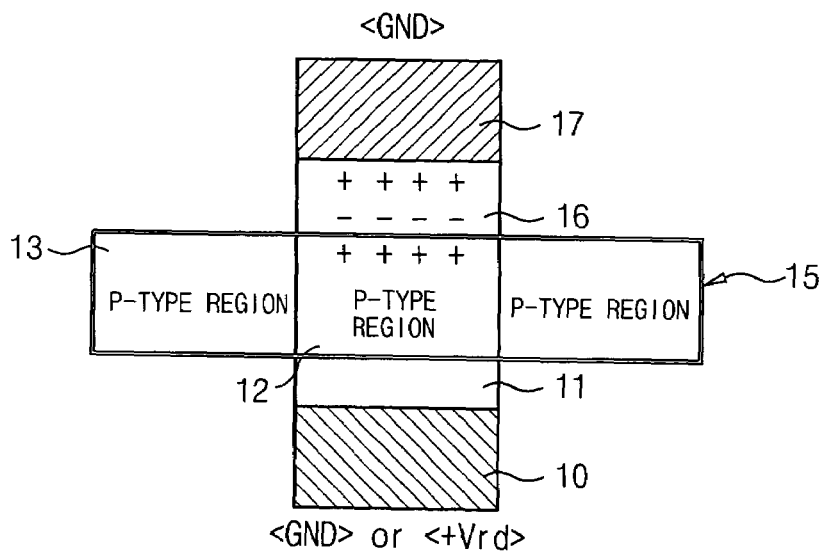
Figure 3C:
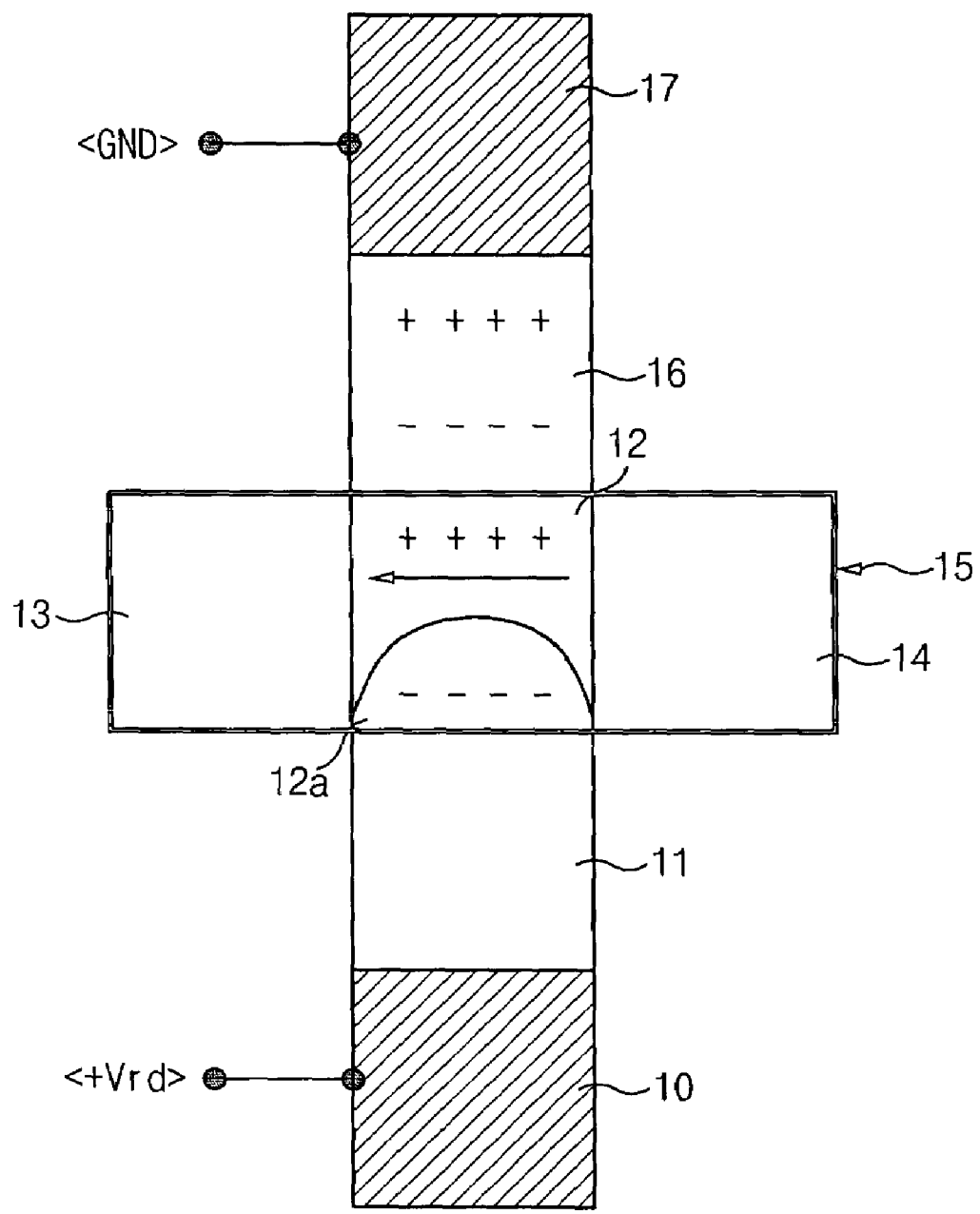

FIGS. 3a and 3c are diagrams illustrating write and read operations on high data of the nonvolatile ferroelectric memory device according to an embodiment of the present invention.

Referring to FIG. 3a, when data "1" is written, a ground voltage <GND> is applied to the bottom word line 10, and a negative voltage <−V> is applied to the word line 17. Here, the drain region 13 and the source region 14 are become at a ground voltage <GND> state.

In this case, a voltage is applied between the ferroelectric layer 16 and the P-type channel region 12 of the floating channel layer 15 by voltage division of a capacitor between the ferroelectric layer 16 and the insulating layer 11. Then, positive charges are induced to the channel region 12 depending on the polarity of the ferroelectric layer 16, so that the memory cell becomes at the low resistance state. As a result, the data "1" is written in all memory cells at the write mode.

Referring to FIGS. 3b and 3c, when the data "1" is read, the ground voltage <GND> or a read voltage <+Vrd> having a positive value is applied to the bottom word line 10. Then, the ground voltage <GND> is applied to the word line 17. Here, a depletion layer 12a is formed in the lower region of the channel region 12 by the read voltage <+Vrd> applied from the bottom word line 10.

However, a depletion layer is not formed in the upper region of the channel region 12 because positive charges are induced thereto. Thus, the channel region 12 is turned on, so that current flows from the source region 14 to the drain region 13. As a result, at the read mode, the data "1" stored in the memory cell is read. Here, since the channel region 12 is turned on even when a low voltage difference is applied to the drain region 13 and the source region 14, a large amount of current flows.

Figure 4A:
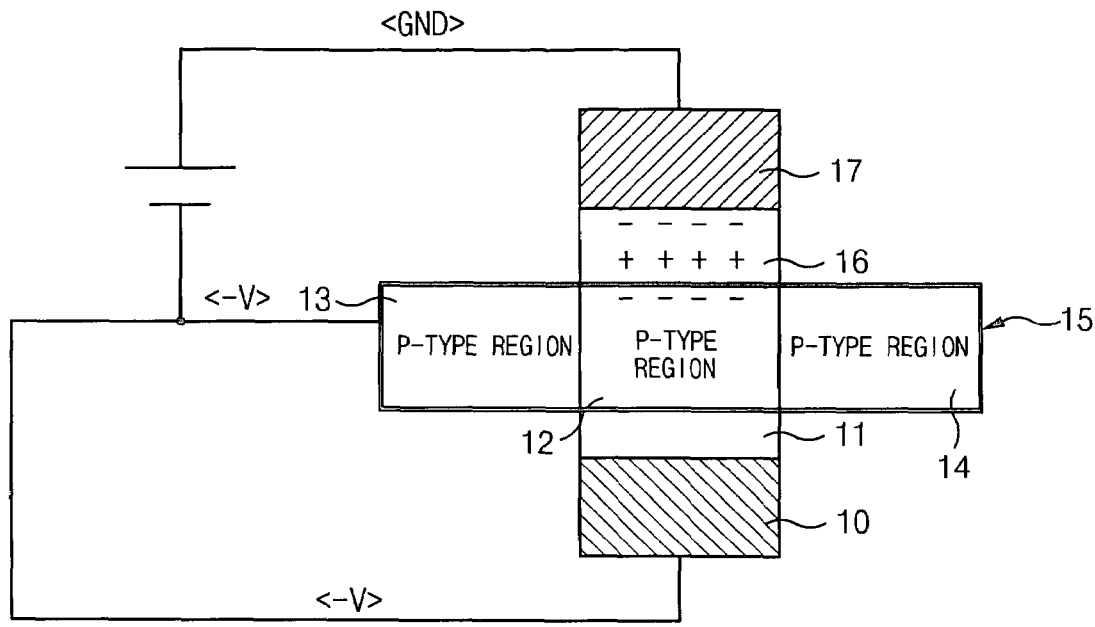
FIGS. 4a and 4c are diagrams illustrating write and read operations on low data of the nonvolatile ferroelectric memory device according to an embodiment of the present invention.
Figure 4B:
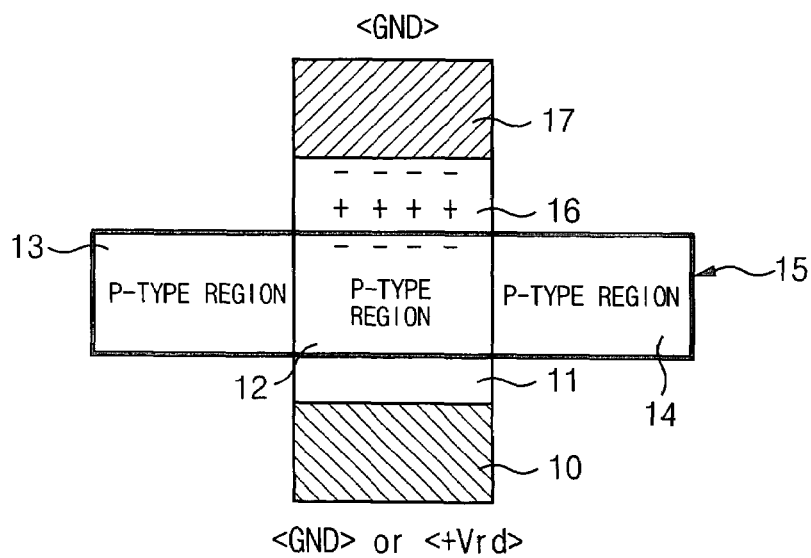
Figure 4C:
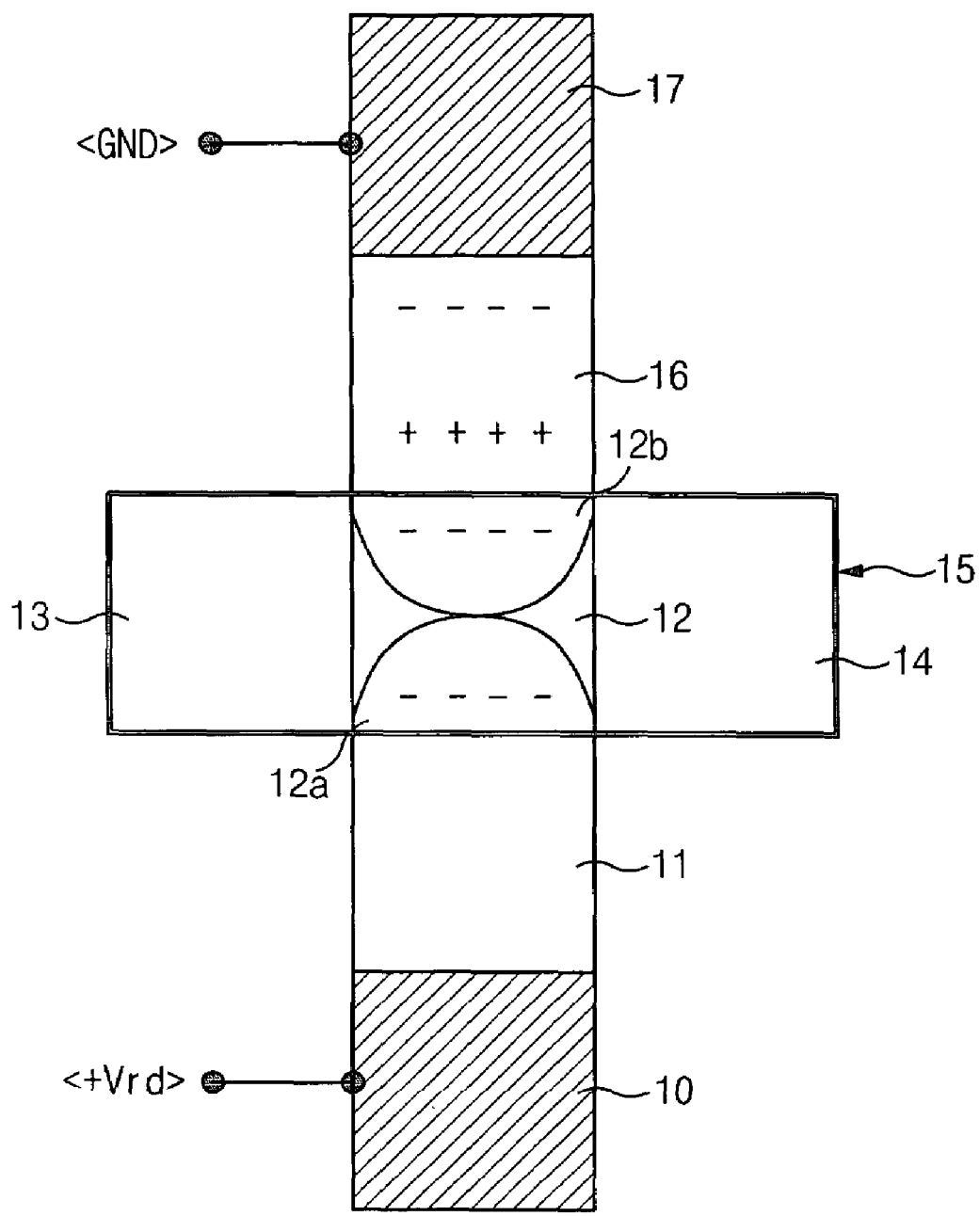

FIGS. 4a and 4c are diagrams illustrating write and read operation on low data of the nonvolatile ferroelectric memory device according to an embodiment of the present invention.

Referring to FIG. 4a, when data "0" is written, a negative voltage <−V> is applied to the bottom word line 10, and a ground voltage <GND> is applied to the word line 17. Here, the negative voltage <−V> is applied to the drain region 13 and the source region 14

In this case, a high voltage is formed between the positive voltage <+V> applied from the word line 17 and the negative voltage <−V> formed in the channel region 12. Then, negative charges are induced to the channel region 12 depending on the polarity of the ferroelectric layer 16, so that the memory cell becomes at a high resistance state. As a result, the data "0" is written in the memory cell at the write mode.

Referring to FIGS. 4b and 4c, when the data "0" is read, the ground voltage <GND> or a read voltage <+Vrd> having a positive value is applied to the bottom word line 10. Then, the ground voltage <GND> is applied to the word line 17.

Here, a depletion layer 12a is formed in the lower region of the channel region 12 by the read voltage <+Vrd> applied from the bottom word line 10. Then, negative charges are induced to the upper region of the channel region 12, so that a depletion layer 12b is formed in the upper region of the channel region 12. Thus, the channel of the channel region 12 is turned off by the depletion layers 12a and 12b formed in the channel region 12, so that a current path is intercepted from the source region 14 to the drain region 13.

A small amount of current flows because the channel region 12 is turned off even when a low voltage difference is applied between the drain region 13 and the source region 14. As a result, at the read mode, the data "0" stored in the memory cell is read.

Therefore, at the read mode, the data maintaining characteristic of the cell can be improved because the word line 17 and the bottom word line 10 are controlled at the ground level so that a voltage stress is not applied to the ferroelectric layer 16.

Figure 5:
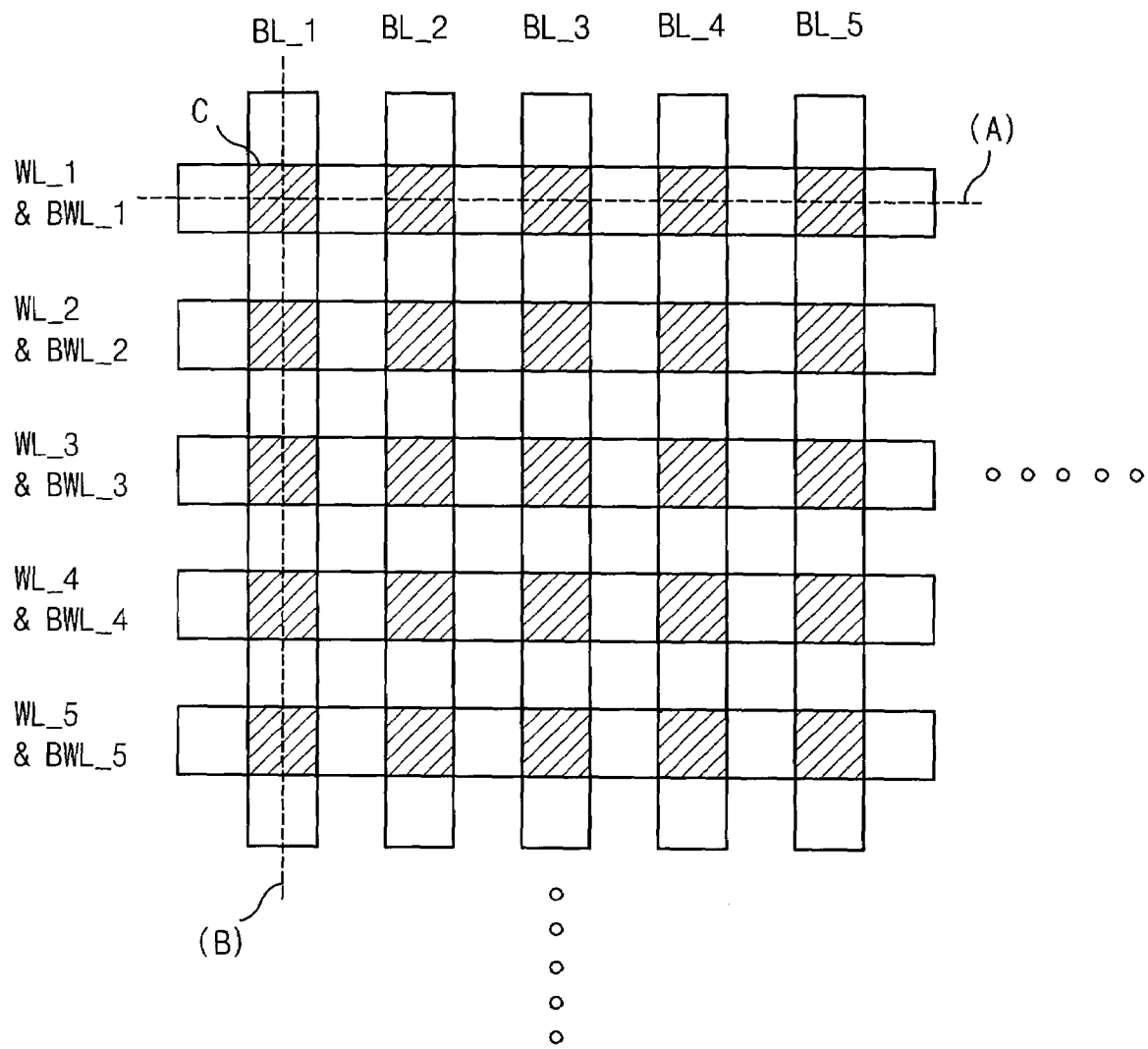
FIG. 5 is a layout cross-sectional diagram illustrating the nonvolatile ferroelectric memory device according to an embodiment of the present invention.

FIG. 5 is a layout cross-sectional diagram illustrating the nonvolatile ferroelectric memory device according to an embodiment of the present invention.

In the embodiment, a plurality of word lines WL are arranged in parallel with a plurality of bottom word lines BWL in a column direction. A plurality of bit lines BL are arranged perpendicular to the plurality of word lines WL. Also, a plurality of unit cells C are located where the plurality of word lines WL, the plurality of bottom word lines BWL and the plurality of bit lines BL are crossed.

Figure 6A:
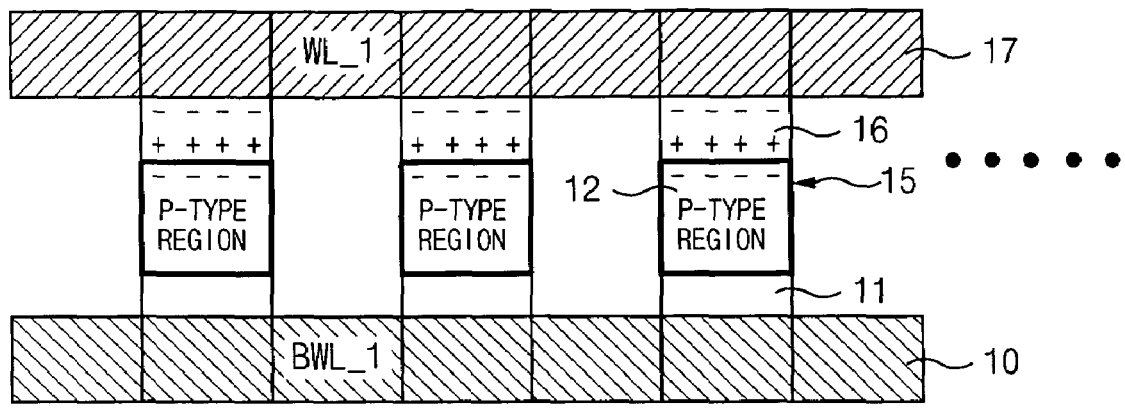
FIGS. 6a and 6b are cross sectional diagrams illustrating the nonvolatile ferroelectric memory device according to an embodiment of the present invention.
Figure 6B:
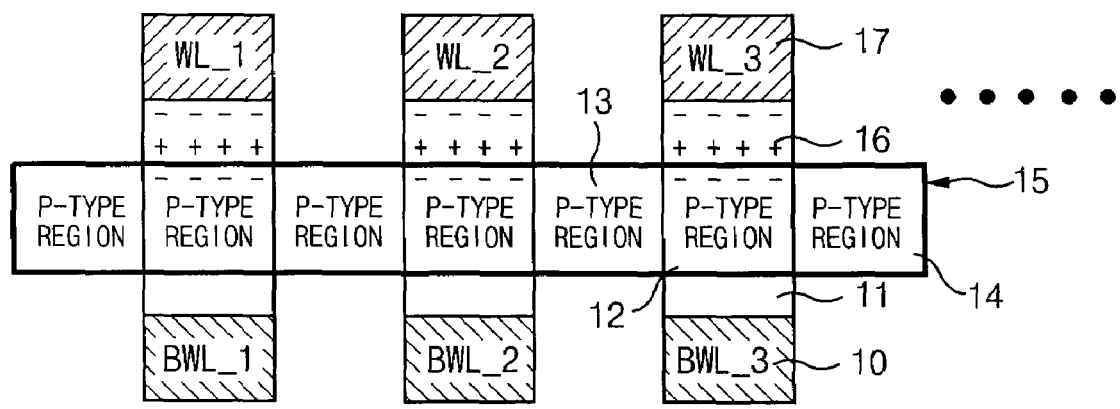

FIGS. 6a and 6b are cross sectional diagrams illustrating the nonvolatile ferroelectric memory device according to an embodiment of the present invention.

FIG. 6a is a diagram illustrating a cross section of the cell array in a direction (A) in parallel with the word line WL of FIG. 5.

In the cell array according to the embodiment of the present invention, a plurality of insulating layers 11 are formed on the bottom word line 10, and a plurality of P-type channel regions 12 are formed on the plurality of insulating layers 11. A plurality of ferroelectric layers 16 are formed on the plurality of channel regions 12, and the word line 17 is formed in parallel with the bottom word line 10 on the plurality of ferroelectric layers 16. As a result, a plurality of cells are connected between one word line WL_1 and one bottom word line BWL_1.

FIG. 6b is a diagram illustrating a cross section of the cell array in a direction (B) perpendicular to the word line WL of FIG. 5.

In the cell array according to the embodiment of the present invention, the insulating layer 11 is formed on each bottom word line BWL_1, BWL_2 and BWL_3. The floating channel layer 15 comprising the P-type drain region 13, the P-type channel region 12 and the P-type source region 14 connected serially is formed on the insulating layer 11.

Here, the P-type drain region 13 can be used as a source region in the adjacent cell, and the P-type source region 14 can be used as a drain region in the adjacent cell. That is, the P-type region is used in common as a drain region and a source region in the adjacent cell.

The ferroelectric layer 16 is formed on each channel region 12 of the floating channel layer 15, and the word lines WL_1, WL_2 and WL_3 are formed on the ferroelectric layer 16.

Figure 7:
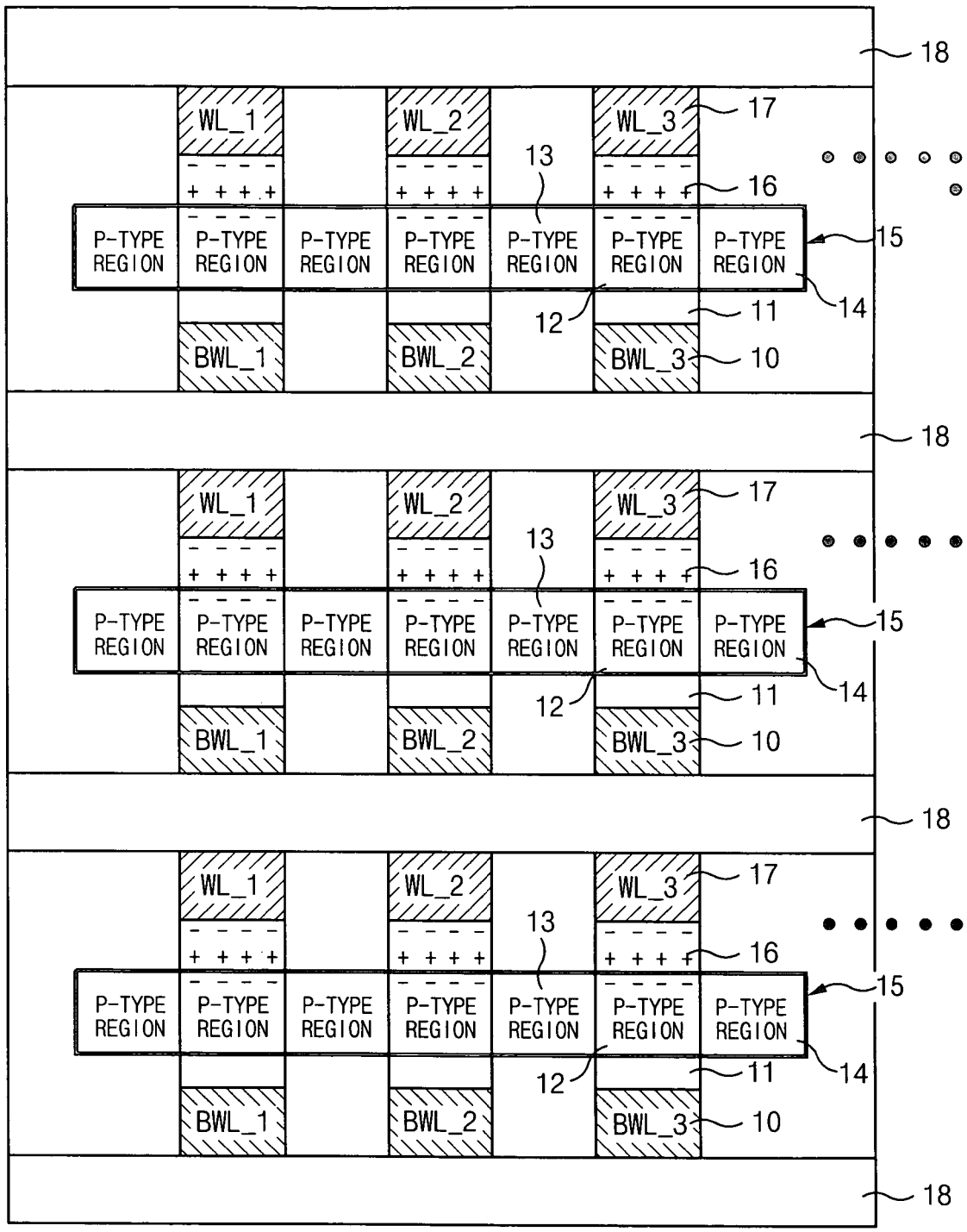
FIG. 7 is a cross-sectional diagram illustrating a nonvolatile ferroelectric memory device having a multiple layer structure according to an embodiment of the present invention.

FIG. 7 is a cross-sectional diagram illustrating a nonvolatile ferroelectric memory device having a multiple layer structure according to an embodiment of the present invention.

Referring to FIG. 7, the unit cell array shown in FIG. 6b is deposited as a multiple layer structure. Each unit cell array is separated by the insulating layer 18.

Figure 8:
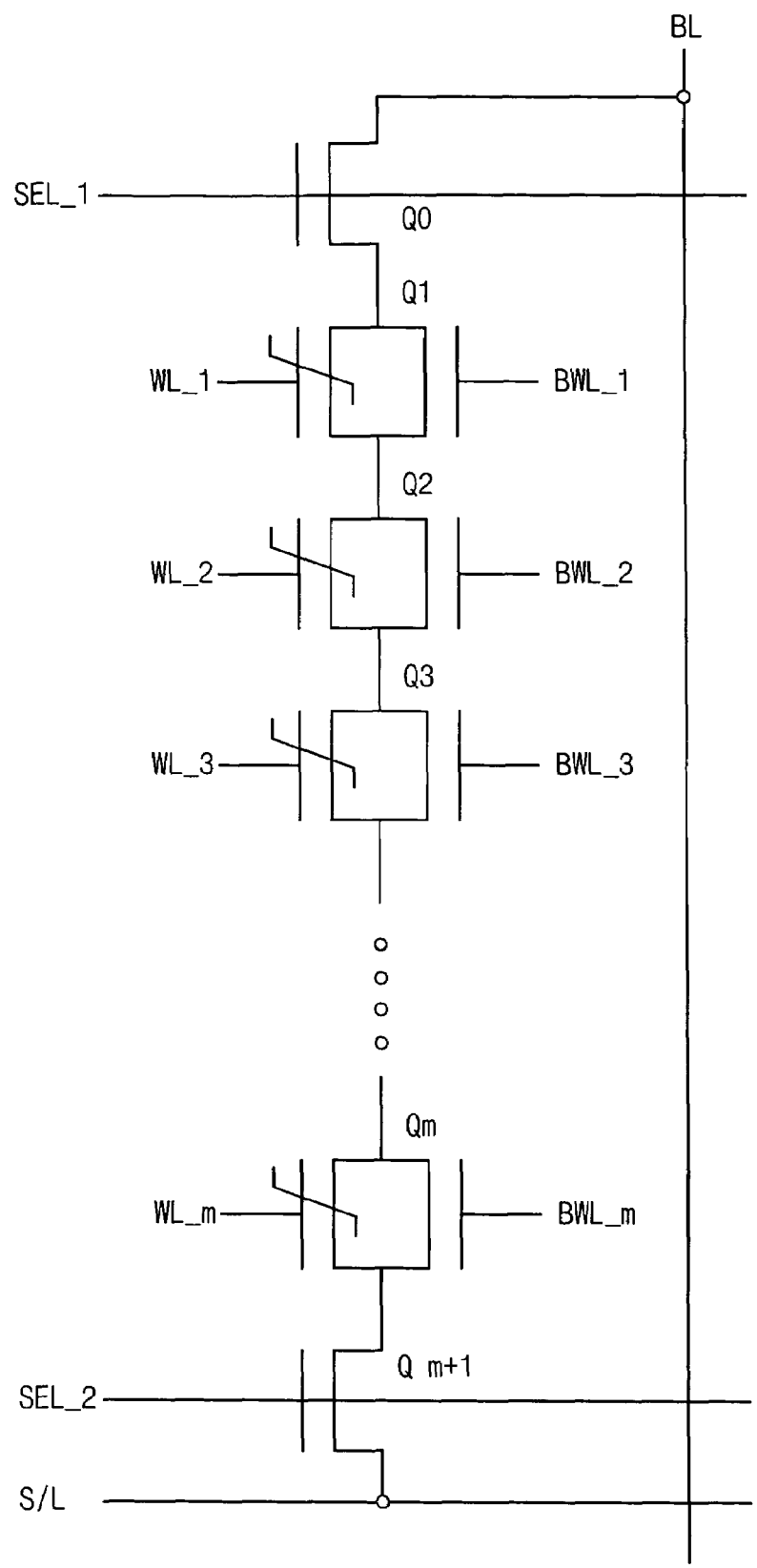
FIG. 8 is a diagram illustrating a unit array of a nonvolatile ferroelectric memory device according to an embodiment of the present invention.

FIG. 8 is a diagram illustrating a unit array of a nonvolatile ferroelectric memory device according to another embodiment of the present invention.

Figure 11:
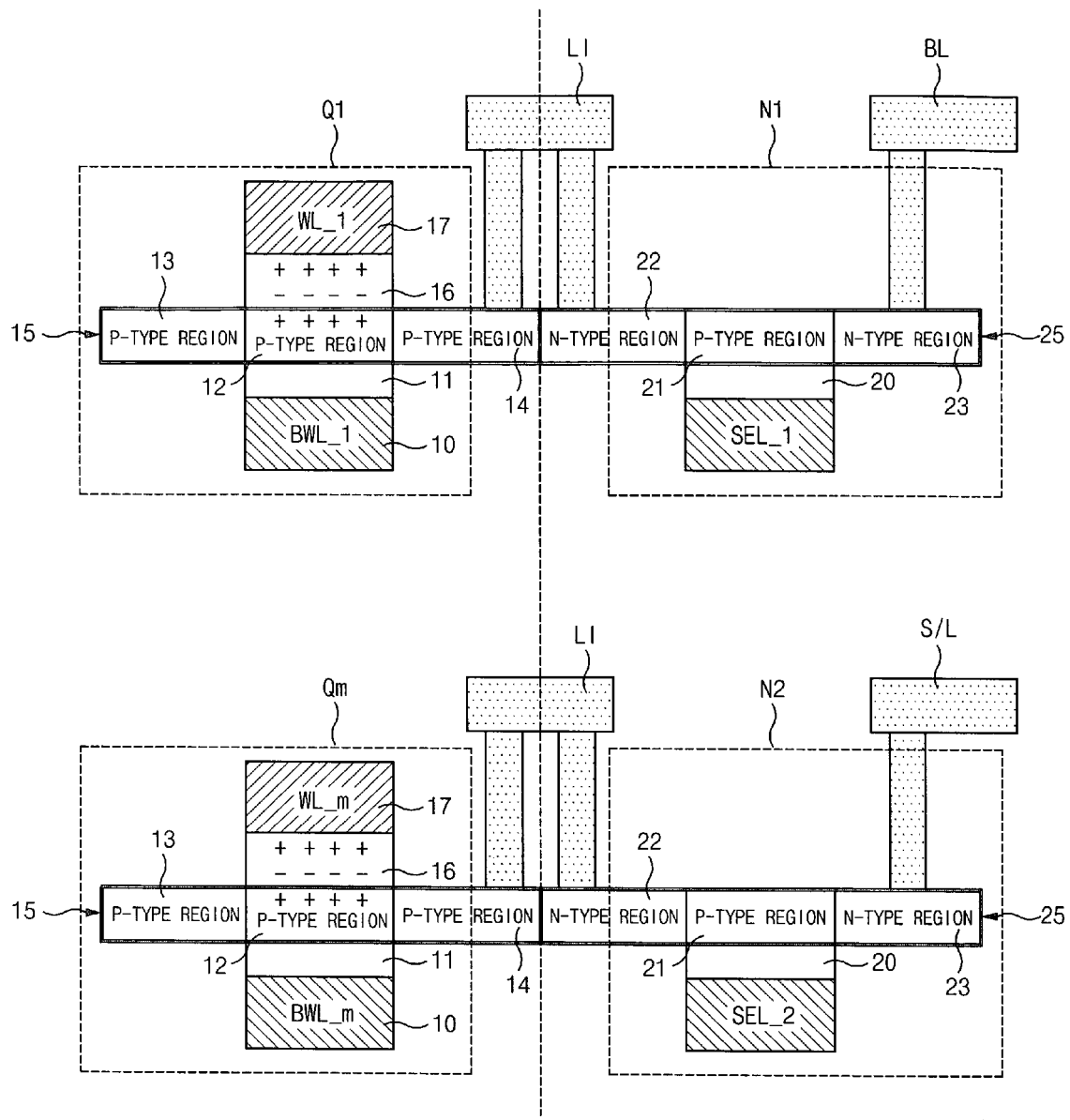
FIG. 11 is a diagram illustrating a unit array of the nonvolatile ferroelectric memory device of FIG. 8.

In the embodiment, the unit array of FIG. 11 comprises switching elements N1, N2 and a plurality of memory cells Q1~Qm. Here, the switching element N1, which is connected between the bit line BL and the memory cell Q1, has a gate to receive a selecting signal SEL_1. The switching element N2, which is connected between a sensing line S/L and the memory cell Qm, has a gate to receive a selecting signal SEL_2.

The plurality of memory cells Q1~Qm, which are connected serially between the switching elements N1 and N2, selectively perform a switching operation by word lines WL_1~WL_m and bottom word lines BWL_1~BWL_m. The detailed structure of each memory cell Q1~Qm is shown in FIG. 2b. Thus, a source of the memory cell Q1 is connected to the switching element N1, and a drain of the memory cell Qm is connected to the switching element N2.

Figure 9:
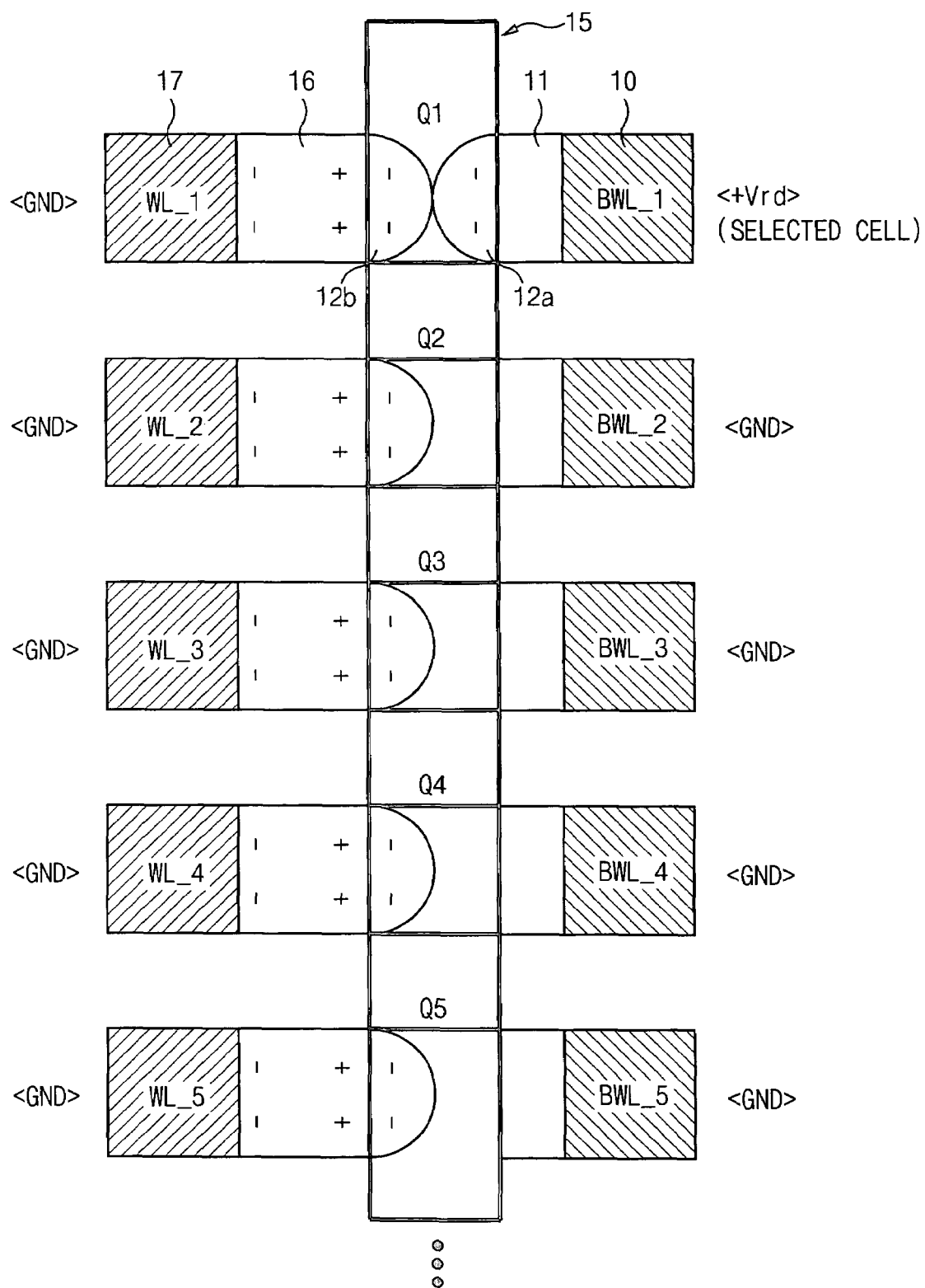
FIG. 9 is a diagram illustrating a read operation on low data of the nonvolatile ferroelectric memory device of FIG. 8.

FIG. 9 is a diagram illustrating a read operation on low data of the nonvolatile ferroelectric memory device of FIG. 8.

First, suppose that the data "0" is stored in the selected memory cell Q1. In this case, the ground voltage <GND> is applied to all of the word lines WL_1~WL_5, and the read voltage <+Vrd> having a positive value is applied to the bottom word line BWL_1 of the selected cell Q1. Then, the ground voltage <GND> is applied to the unselected rest of the plurality of bottom word lines BWL_2~BWL_m.

Here, the ground voltage <GND> is applied to the word line 17 and the bottom word line 10 in the unselected rest memory cells Q2~Q5. As a result, the depletion layer 12a is not formed in the lower region of the channel region 12, so that the channel is turned on.

On the other hand, the depletion layer 12a is formed in the lower region of the channel region 12 and depletion layer 12b is formed in the upper of the channel region 12 by the read voltage <+Vrd> applied to the bottom word line 10 in the selected memory cell Q1. Then, the channel of the channel region 12 is turned off by the depletion layers 12a and 12b formed in the channel region 12, so that the current path is intercepted from the source region 14 to the drain region 13. As a result, the data "0" stored in the selected memory cell Q1 is read at the read mode.

Figure 10:
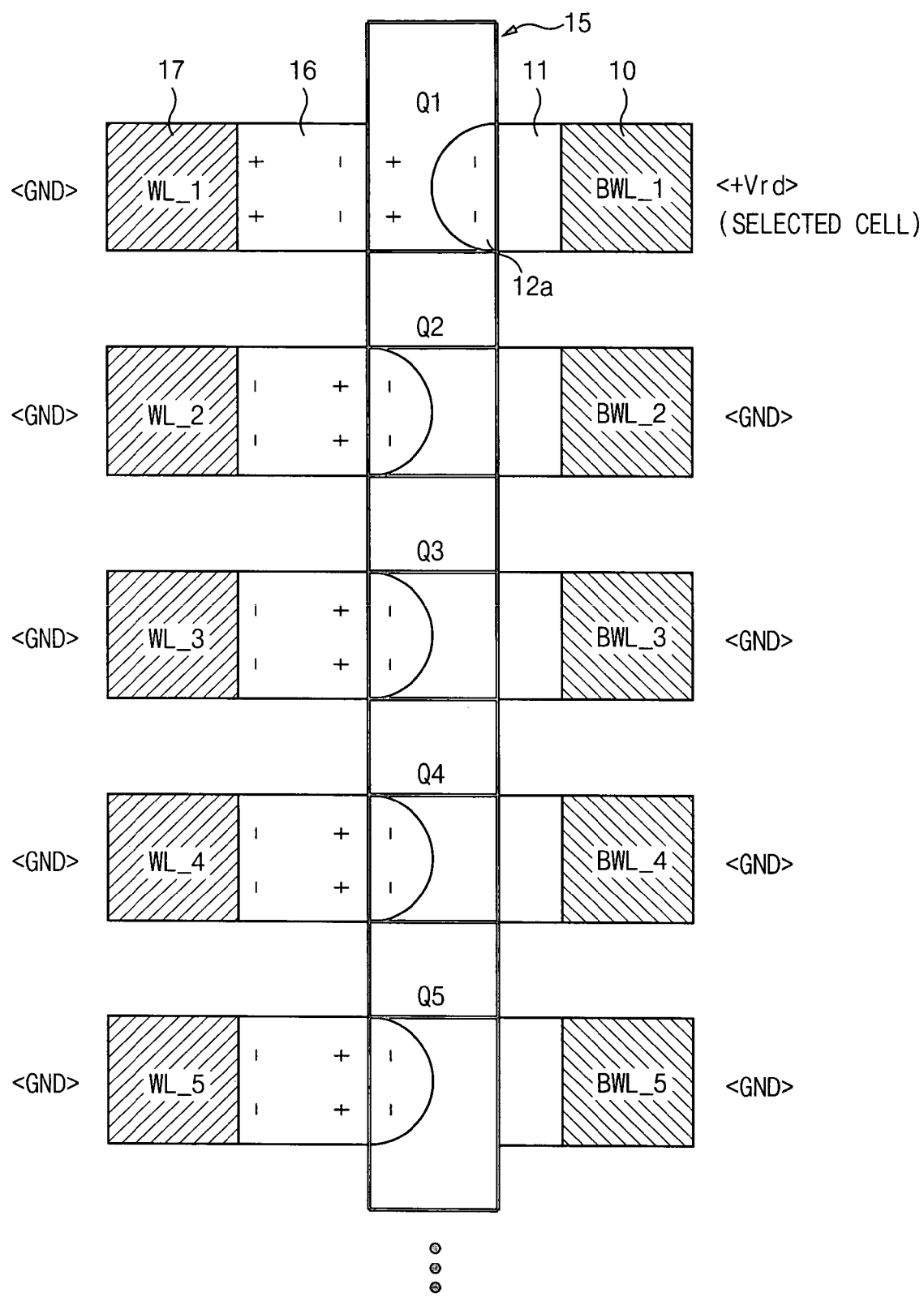
FIG. 10 is a diagram illustrating a read operation on high data of the nonvolatile ferroelectric memory device of FIG. 8.

FIG. 10 is a diagram illustrating a read operation on high data of the nonvolatile ferroelectric memory device of FIG. 8.

First, suppose that the data "1" is stored in the selected memory cell Q1. In this case, the ground voltage <GND> is applied to all of the word lines WL_1~WL5, and the read voltage <+Vrd> having a positive value is applied to the bottom word line BWL_1 of the selected cell Q1. Then, the ground voltage <GND> is applied to the unselected rest of the plurality of bottom word lines BWL_2~BWL_m.

Here, the ground voltage <GND> is applied to the word line 17 and the bottom word line 10 in the unselected rest memory cells Q2~Q5. As a result, the depletion layer 12a is not formed in the lower region of the channel region 12, so that the channel is turned on.

On the other hand, the depletion layer 12a is formed in the lower region of the channel region 12 by the read voltage <+Vrd> applied to the bottom word line 10 in the selected memory cell Q1. Then, positive charges are induced to the upper region of the channel region 12, so that the depletion layer is not formed. Thus, the channel region 12 is turned on, so that current flows from the source region 14 to the drain region 13. As a result, the data "1" stored in the selected memory cell Q1 is read at the read mode.

FIG. 11 is a diagram illustrating the connection relationship of the memory cells Q1, Qm and the switching elements N1, N2 shown in FIG. 8.

Each of the switching elements N1 and N2 comprises a P-type channel region 21 formed on an insulating layer 20, a N-type drain region 22 and a N-type source region 23 which are connected to both sides of the P-type channel region 21. Here, the N-type source region 25 is connected to the bit line BL. The N-type drain region 22 is connected to the P-type source region 14 through a connection line L1. Here, the connection line L1 for connecting the switching elements N1, N2 to the memory cells Q1, Qm is formed of a metal conductor.

Figure 12:
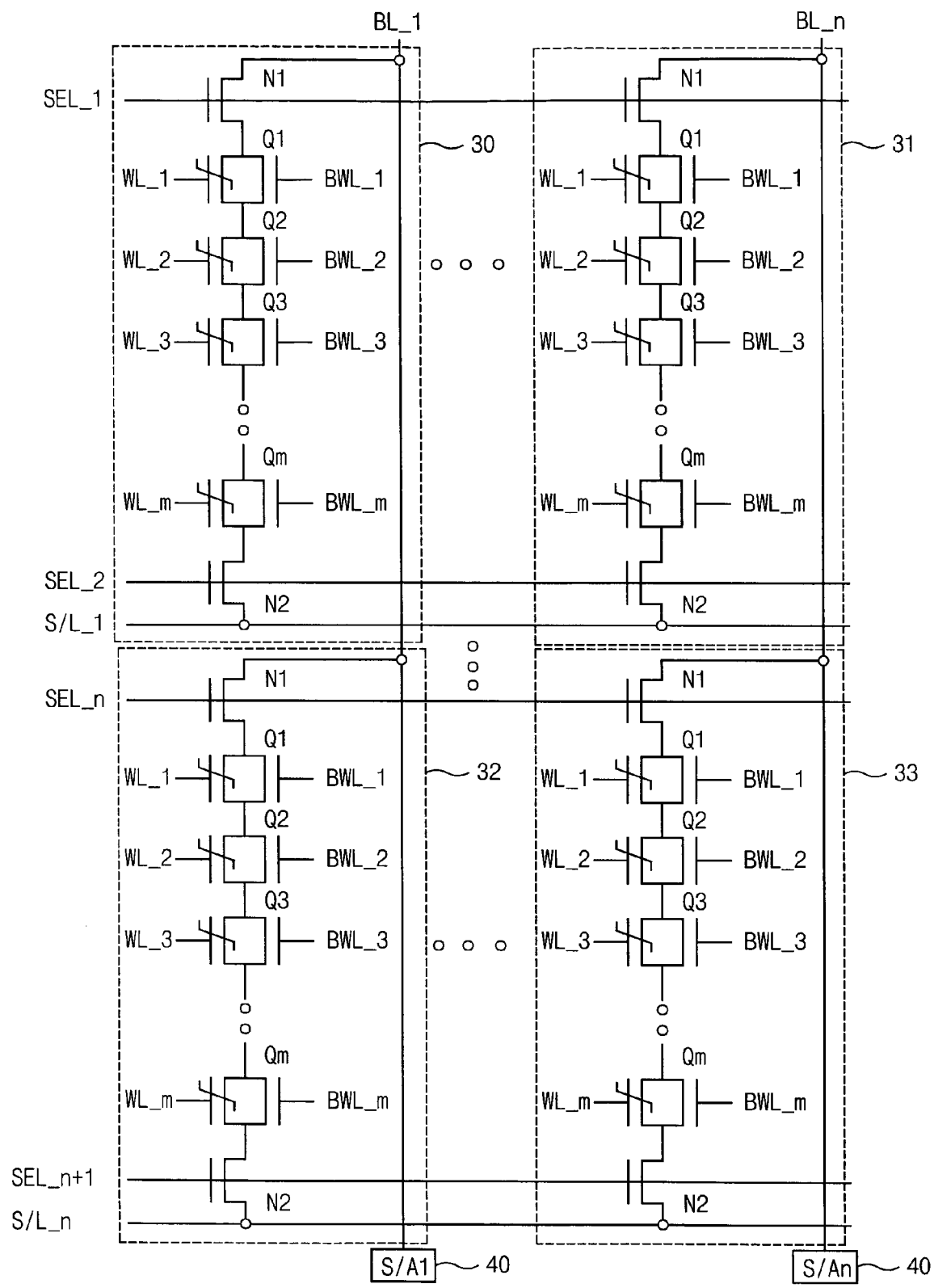
FIG. 12 is a diagram illustrating an array of a nonvolatile ferroelectric memory device according to an embodiment of the present invention.

FIG. 12 is a diagram illustrating an array of a nonvolatile ferroelectric memory device according to an embodiment of the present invention.

In the embodiment, a plurality of unit cell arrays 30~33 are arranged where a plurality of bit lines BL_1~BL_n and a plurality of sensing lines S/L_1~S/L_n are crossed in row and column directions. The structure of each unit cell array 30~33 is shown in FIG. 8. The plurality of bit lines BL_1~BL_n are connected one by one to a plurality of sense amplifiers 40.

Figure 13:
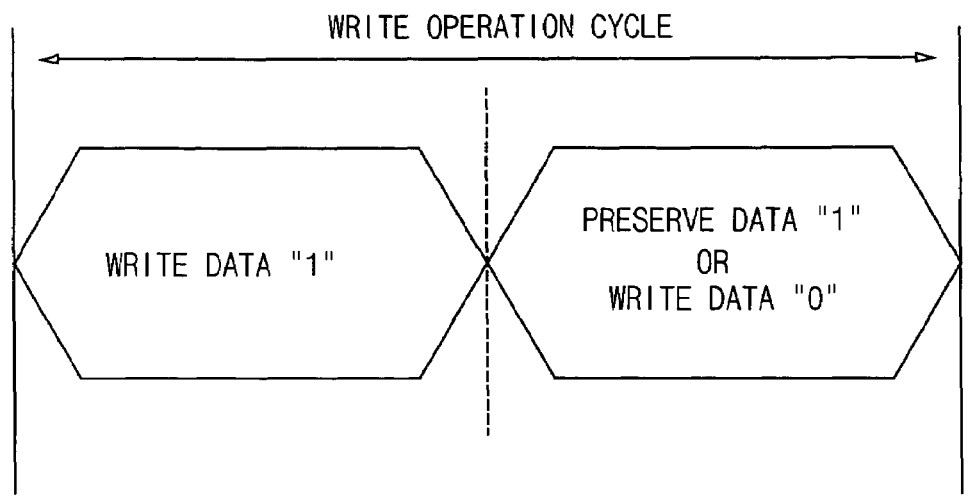
FIG. 13 is a diagram illustrating a write operation of the nonvolatile ferroelectric memory according to an embodiment of the present invention.

FIG. 13 is a diagram illustrating a write operation of the nonvolatile ferroelectric memory according to an embodiment of the present invention.

In the embodiment, a write operation cycle can be divided into two sub operation regions. That is, the data "1" is written in the first sub operation region, and the data "0" is written in the second sub operation region.

A high voltage is applied to the bit line in a predetermined period when the data "1" is required to be preserved. As a result, a value of the data "1" written in the first sub operation region can be preserved in the memory cell.

Figure 14:
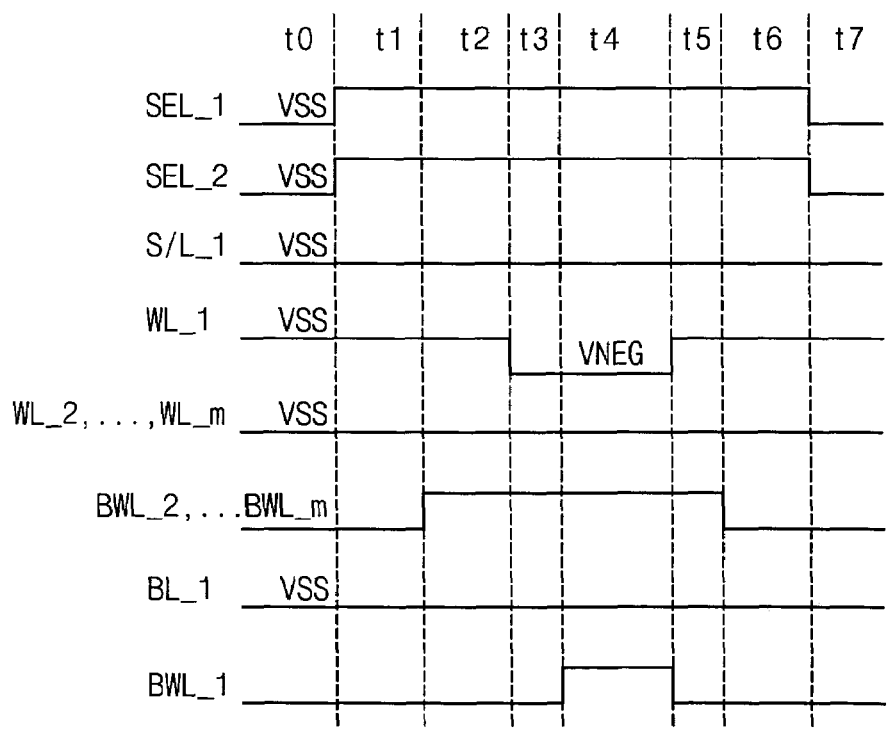
FIG. 14 is a timing diagram illustrating a write operation of high data in the nonvolatile ferroelectric memory device according to an embodiment of the present invention.

FIG. 14 is a timing diagram illustrating the write operation of the data "1" in the nonvolatile ferroelectric memory device according to an embodiment of the present invention.

First, suppose that the memory cell Q1 shown in FIG. 5 is selected when the data "1" is written. A period t0 is defined as a precharge period of the memory cell.

In a period t1, when the selecting signals SEL_1 and SEL_2 transit to 'high', the switching elements N1 and N2 are turned on. As a result, the bit line BL is connected to a source of the memory cell Q1, and the sensing line S/L is connected to a drain of the memory cell Qm.

Here, a plurality of word lines WL_1~WL_m and a plurality of bottom word lines BWL_1~BWL_m are maintained at a low level. Then, the bit line BL_1 and the sensing line S/L_1 are maintained at a low state.

Next, in a period t3, a negative voltage VNEG is applied to the word line WL_1 connected to the selected memory cell Q1. As shown in FIG. 3a, a high voltage is applied to the ferroelectric layer 16 between the word line WL_1 and the channel region 12, so that the data "1" is written.

In a period t5, the word line WL_1 is transited to the ground state, again. Thereafter, in a period t7, when the selecting signals SEL_1 and SEL_2 transit to 'low', the switching elements N1 and N2 are turned off. Here, in all the periods, the sensing line S/L_1, the bit line BL_1, the bottom word lines BWL_1~BWL_m and the unselected word lines WL_2~WL_m are maintained at the ground state.

Figure 15:
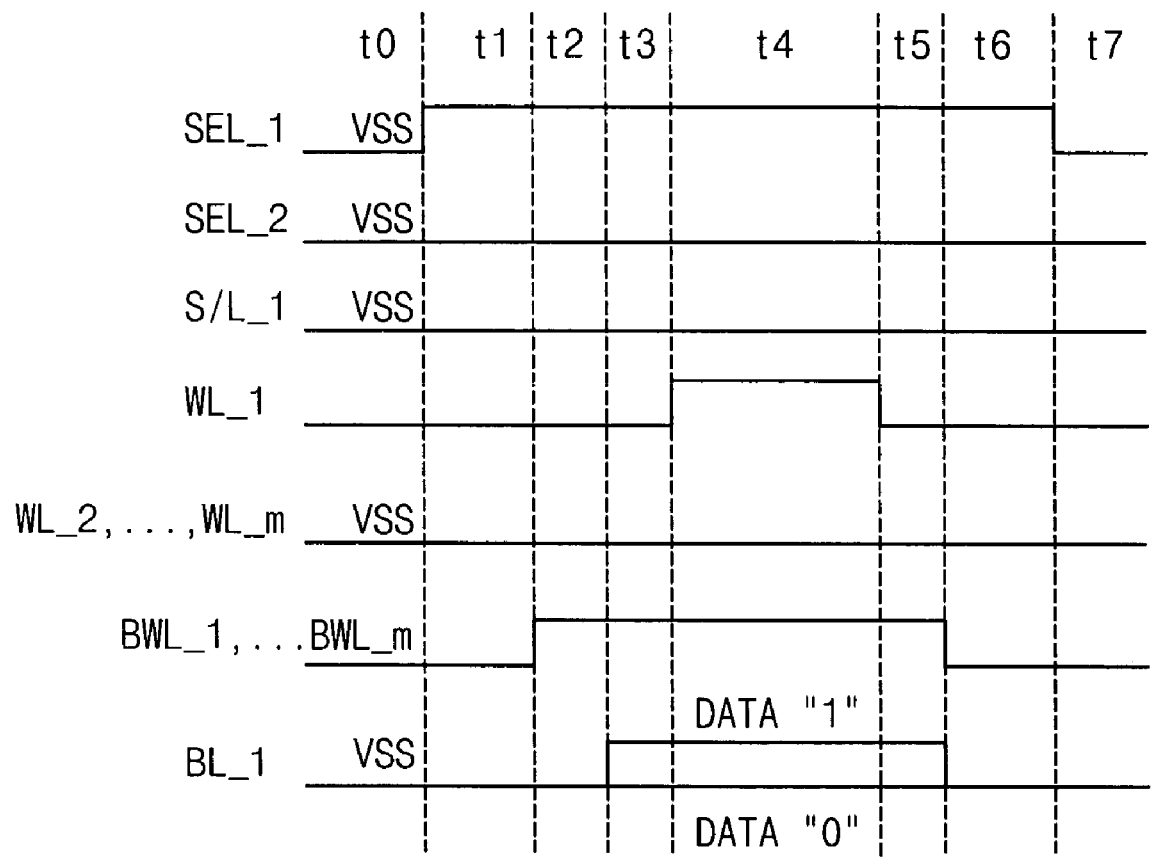
FIG. 15 is a timing diagram illustrating a write operation of low data and high data maintenance in the nonvolatile ferroelectric memory device according to an embodiment of the present invention.

FIG. 15 is a timing diagram illustrating the write operation of the data "0" and the maintenance operation of the data "1" in the nonvolatile ferroelectric memory device according to an embodiment of the present invention.

First, suppose that the memory cell Q1 shown in FIG. 5 is selected when the data "0" is written. A period t0 is defined as a precharge period of the memory cell.

In a period ti, when the selecting signal SEL_1 transits to 'high', the switching element N1 is turned on. As a result, the bit line BL is connected to the source of the memory cell Q1. Then, the selecting signal SEL_2 transits to a value of the negative voltage VNEG.

Here, the plurality of word lines WL_1~WL_m, the bottom word line BWL_1 connected to the selected memory cell Q1, the bit line BL_1 and the sensing line S/L_1 are maintained at the low state. Then, the unselected rest bottom word lines BWL_2~BWL_m are transited to the negative voltage VNEG, so that the current path is formed.

As a result, all of the memory cells Q1~Qm are connected to the bit line BL through the bottom word lines BWL_2~BWL_m, so that data applied to the bit line BL are transmitted to all of the cells Q1~Qm.

In a period t3, when the data to be written in the memory cell Q1 is "0", the bit line BL_1 is transited to the negative voltage VNEG level. On the other hand, the bit line BL_1 is continuously maintained at the ground voltage state when the data "1" stored in the memory cell Q1 is required to be maintained.

In a period t4, the bottom word line BWL_1 is transited to the negative voltage VNEG level. As shown in FIG. 4a, electrons are accumulated in the P-type channel region 12 of the memory cell Q1 by the bottom word line BWL_1. Then, the ground voltage <GND> is applied to the word line WL_1, and a threshold voltage difference is generated. Thus, the polarity is formed so that channel electrons may be induced to the ferroelectric layer 16. As a result, the data "0" is written in the memory cell Q1.

When the data "1" stored in the memory cell Q1 is required to be maintained, the ground voltage <GND> is applied to the bit line BL_1, so that a voltage of the bit line BL_1 is applied to the memory cell Q1. As a result, since the electrons are prevented from being formed in the channel region 12, the data "1" can be preserved.

Thereafter, in a period t5, the bottom word line BWL_1 is transited to the ground state. In a period t7, the bottom word lines BWL_2~BWL_m and the selecting signal SEL_2 are transited to the ground state, so that the write operation is completed. When the selecting signal SEL_1 transits to 'low', the switching element N1 is turned off.

Figure 16:
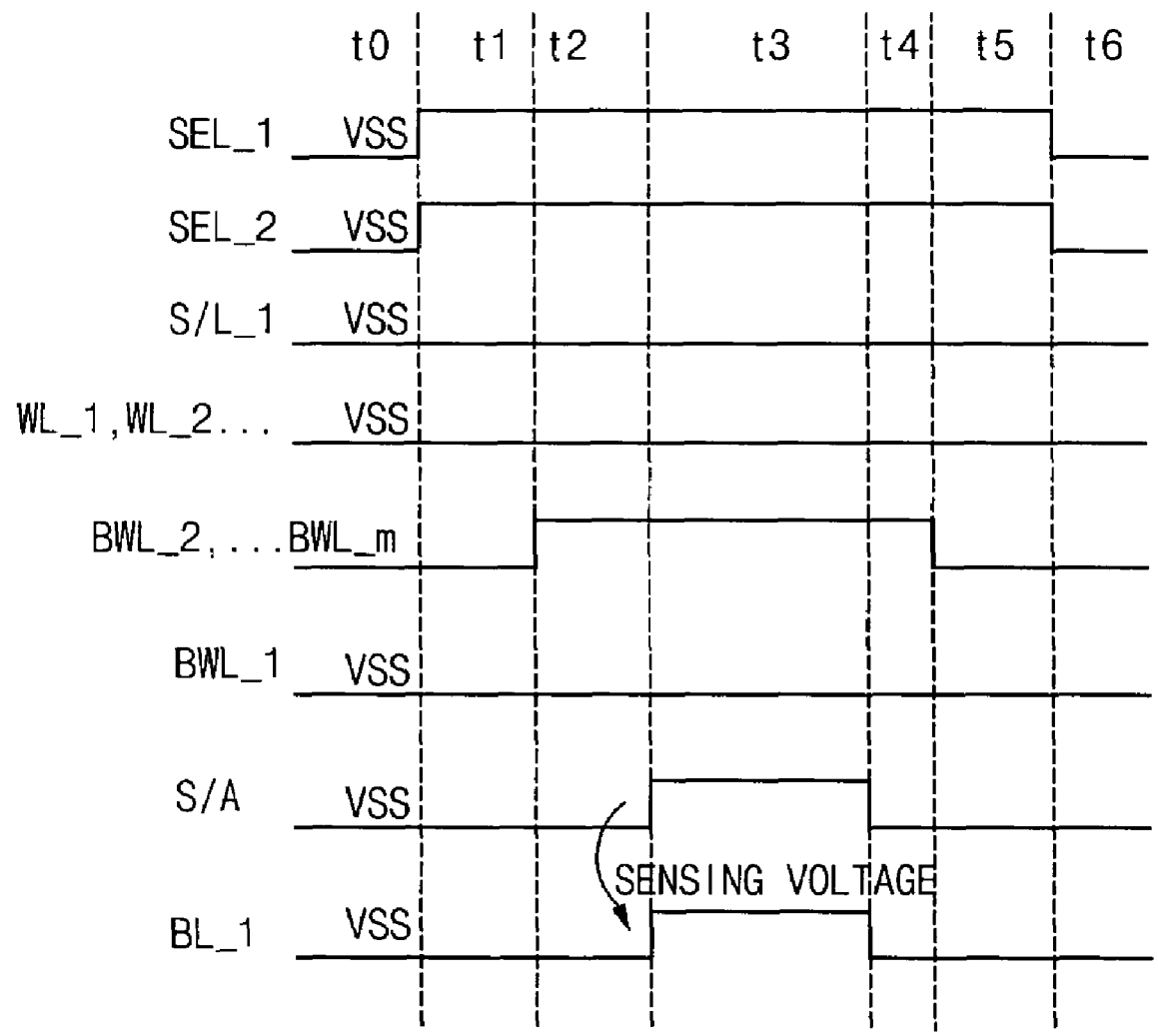
FIG. 16 is a timing diagram illustrating a sensing operation of cell data in the nonvolatile ferroelectric memory device according to an embodiment of the present invention.

FIG. 16 is a timing diagram illustrating a sensing operation of cell data in the nonvolatile ferroelectric memory device according to an embodiment of the present invention.

First, suppose that the memory cell Q1 shown in FIG. 8 is selected when the data is sensed. A period t0 is defined as a precharge period of the memory cell.

In a period t1, when the selecting signals SEL_1 and SEL_2 transit to 'high', the switching elements N1 and N2 are turned on. As a result, the bit line BL is connected to the source of the memory cell Q1, and the sensing line S/L is connected to the drain of the memory cell Qm.

Here, the plurality of word lines WL_1~WL_m and the plurality of bottom word lines BWL_1~BWL_m are maintained at the low state. The sense amplifier 40, the bit line BL_1 and the sensing line S/L_1 are maintained at the low state.

In a period t2, the bottom word line BWL_1 connected to the selected memory cell Q1 transits to 'high'. As a result, the rest memory cells Q2~Qm except the selected memory cell Q1 are connected to the sensing line S/L_1.

Here, the plurality of word lines WL_1~WL_m and the unselected rest bottom word lines BWL_2~BWL_m are maintained all at the ground state. Thus, the flowing of current between the bit line BL_1 and the sensing line S/L is determined depending on the polarity state formed in the memory cell Q1.

In a period t3, when the sense amplifier 40 is operated so that a sensing voltage is applied to the bit line BL_1, the flowing of current of the bit line BL_1 is determined depending on the data stored in the memory cell Q1.

As shown in FIG. 9, when current is not applied to the bit line BL_1, it is understood that the data "0" is stored in the memory cell Q1. On the other hand, as shown in FIG. 10, when a current over a predetermined value is applied to the bit line BL_1, it is understood that the data "1" is stored in the memory cell Q1.

In a period t4, when the operation of the sense amplifier 40 is stopped, the bit line BL_1 transits to 'low', so that the sensing operation is completed. In a period t5, the bottom word line BWL_1 transit to 'low'. In a period t6, when the selecting signals SEL_1 and SEL_2 transit to 'low', the switching elements N1 and N2 are turned off.

Although the floating channel 15 comprising the P-type drain region 13, the P-type channel region 12 and the P-type source region 14 is exemplified here, the present invention is not limited but the floating channel layer 15 can comprise a N-type drain region, a N-type channel region and a N-type source region.

As described above, in an embodiment of the present invention, data of a cell are not destroyed at a read mode by using a NDRO (Non Destructive Read Out). As a result, reliability of the cell can be improved at a low voltage of a nano scale ferroelectric cell and a read operation speed can be also improved. Additionally, a plurality of ferroelectric unit cell arrays are deposited to improve integrated capacity of the cell, thereby reducing the whole size of the cell.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric memory device comprising:
a bottom word line;
an insulating layer formed on the bottom word line;
a floating channel layer comprising a P-type channel region formed on the insulating layer and kept at a floating state, a P-type drain region and a P-type source region which are connected to both sides of the channel region;
a ferroelectric layer formed on the channel region of the floating channel layer; and
a word line formed on the ferroelectric layer,
wherein different channel resistance is induced to the channel region depending on polarity states of the ferroelectric layer, so that data are read and written.

2. The nonvolatile ferroelectric memory device according to claim 1, wherein the floating channel layer is formed of at least one of carbon nano tube, silicon and germanium.

3. The nonvolatile ferroelectric memory device according to claim 1, wherein a channel of the floating channel layer is turned on when positive charges are induced to the channel region depending on the polarity of the ferroelectric layer to cause a low resistance state, and turned off when negative charges are induced to the channel region depending on the polarity of the ferroelectric layer to cause a high resistance state.

4. The nonvolatile ferroelectric memory device according to claim 1, wherein the floating channel layer writes high data when positive charges are induced to the channel region while a ground voltage is applied to the bottom word line, a negative voltage is applied to the word line and a ground voltage is applied to the drain region and the source region, and the floating channel layer reads high data when a read voltage having a positive value is applied to the bottom word line, and a ground voltage is applied to the word line so that the channel of the floating channel layer is turned on.

5. The nonvolatile ferroelectric memory device according to claim 1, wherein the floating channel layer writes low data when a negative voltage is applied to the bottom word line, a ground voltage is applied to the word line, and a negative voltage is applied to the drain region and the source region so that negative charges are induced to the channel region, and the floating channel layer reads low data when a read voltage having a positive value is applied to the bottom word line, and a ground voltage is applied to the word line so that the channel of the floating channel layer is turned off.

6. A nonvolatile ferroelectric memory device comprising a unit cell array which includes:
   a plurality of bottom word lines;
   a plurality of insulating layers formed on the plurality of bottom word lines, respectively;
   a floating channel layer comprising a plurality of P-type channel regions located on the plurality of insulating layers and a plurality of P-type drain regions and a plurality of P-type source regions which are alternately connected in series to the plurality of P-type channel regions;
   a plurality of ferroelectric layers formed respectively on the plurality of P-type channel regions of the floating channel layer; and
   a plurality of word lines formed on the plurality of ferroelectric layers, respectively,
   wherein the unit cell array reads and writes a plurality of data by inducing different channel resistance to the plurality of P-type channel regions depending on polarity states of the plurality of ferroelectric layers.

7. The nonvolatile ferroelectric memory device according to claim 6, wherein the unit cell array includes a plurality of layers and each of the plurality of layers is separated by an insulating layer.

8. A nonvolatile ferroelectric memory device comprising:
   a plurality of memory cells whose switching operations are selectively controlled respectively depending on voltages applied to a plurality of word lines and a plurality of bottom word lines, and where floating channel layers are connected serially;
   a first switching element for selectively connecting one of the plurality of memory cells to a bit line in response to a first selecting signal;
   a second switching element for selectively connecting the other of the plurality of memory cells to a sensing line in response to a second selecting signal,
   wherein each of the plurality of memory cells comprises:
   a bottom word line;
   an insulating layer formed on the bottom word line;
   the floating channel layer comprising a P-type channel region formed on the insulating layer and kept at a floating state, a P-type drain region and a P-type source region which are connected to both sides of the channel region;
   a ferroelectric layer formed on the channel region of the floating channel layer; and
   a word line formed on the ferroelectric layer.

9. The nonvolatile ferroelectric memory device according to claim 8, wherein the first switching element and the second switching element are kept on when high data are written in the plurality of memory cells, the first selecting signal transits to a high level and the second selecting signal transits to a negative voltage level when low data are written in the plurality of memory cells.

10. The nonvolatile ferroelectric memory device according to claim 8, wherein one selected from the plurality of memory cells writes high data when a ground voltage is applied to the bottom word line, a negative voltage is applied to the word line and a ground voltage is applied to the bit line and the sensing line, and
   one selected from the plurality of memory cells writes low data when a negative voltage is applied to the bottom word line and a ground voltage is applied to the word line and a negative voltage is applied to bit line.

11. The nonvolatile ferroelectric memory device according to claim 10, wherein when the high data is written, a plurality of word lines and bottom word lines connected to ones unselected from the plurality of memory cells are kept at a low state.

12. The nonvolatile ferroelectric memory device according to claim 10, wherein the when the low data is written, a plurality of word lines connected to ones unselected from the plurality of memory cells are kept at a low state and a plurality of bottom word lines are kept at a negative voltage state.

13. The nonvolatile ferroelectric memory device according to claim 8, wherein one selected from the plurality of memory cells reads data depending on a value of current flowing in the floating channel layer while a read voltage having a positive value is applied to the bottom word line and a ground voltage is applied to the word line.

14. The nonvolatile ferroelectric memory device according to claim 8, wherein the floating channel layer further comprises a connection line formed of a metal conductor for connecting the P-type drain and source regions to the first switching element and the second switching element.

15. A nonvolatile ferroelectric memory device comprising:
   a plurality of bit lines arranged in a row direction;
   a plurality of sensing lines arranged perpendicular to the plurality of bit lines;
   a plurality of memory cells arranged in row and column directions where the plurality of bit lines and the plurality of sensing lines are crossed; and
   a plurality of sense amplifiers connected one by one to the plurality of bit lines,
   wherein each of the plurality of memory cells comprises:
   a bottom word line;
   an insulating layer formed on the bottom word line;
   the floating channel layer comprising a P-type channel region formed on the floating layer and kept at a floating state, a P-type drain region and a P-type source region which are connected to both sides of the channel region;
   a ferroelectric layer formed on the channel region of the floating channel layer; and
   a word line formed on the ferroelectric layer.

16. The nonvolatile ferroelectric memory device according to claim 15, wherein each of the plurality of memory cells further comprises:
   a first switching element for selectively connecting one of the plurality of memory cells to a bit line in response to a first selecting signal; and
   a second switching element for selectively connecting the other of the plurality of memory cells to a sensing line in response to a second selecting signal.

17. The nonvolatile ferroelectric memory device according to claim 16, wherein the first switching element and the second switching element are kept on when high data are written in the plurality of memory cells, the first switching element transits to a high voltage level and the second switching element transits to a negative voltage level when low data are written in the plurality of memory cells.

18. The nonvolatile ferroelectric memory device according to claim 15, wherein one selected from the plurality of memory cells writes high data when a ground voltage is applied to the bottom word line, a negative voltage is applied to the word line and a ground voltage is applied to the bit line and the sensing line, and one selected from the plurality of memory cells writes low data when a negative voltage is applied to the bottom word line, a ground voltage is applied to the word line and a negative voltage is applied to the bit line.

19. The nonvolatile ferroelectric memory device according to claim 16, wherein the first switching element and the second switching element are kept on at the read mode of the plurality of memory cells.

20. The nonvolatile ferroelectric memory device according to claim 19, wherein one selected from the plurality of memory cells reads data depending on a value of current flowing in the floating channel layer when a read voltage having a positive value is applied to the bottom word line and a ground voltage is applied to the word line.

* * * * *